United States Patent [19]

Lee et al.

[11] Patent Number: 5,768,046

[45] Date of Patent: Jun. 16, 1998

[54] VCR HEAD DRUM COATED WITH DIAMOND-LIKE HARD CARBON FILMS AND THE METHOD AND APPARATUS FOR MANUFACTURING THE SAME

[75] Inventors: Kwang-Ryeol Lee; Kwang-Yong Eun; Keun-Mo Kim, all of Seoul, Rep. of Korea

[73] Assignee: Korea Institute of Science and Technology, Seoul, Rep. of Korea

[21] Appl. No.: 820,163

[22] Filed: Mar. 19, 1997

Related U.S. Application Data

[62] Division of Ser. No. 503,208, Jul. 17, 1995, Pat. No. 5,695,565.

[30] Foreign Application Priority Data

Jul. 26, 1994 [KR] Rep. of Korea ............... 94-18059

[51] Int. Cl.$^6$ .............. G11B 5/40; C23C 16/00
[52] U.S. Cl. .......... 360/84; 360/130.24; 204/192.16
[58] Field of Search ......... 360/84, 107, 130.21–130.24; 204/192.16

[56] References Cited

U.S. PATENT DOCUMENTS

| | | | |
|---|---|---|---|
| 4,105,284 | 8/1978 | Olshansky | 350/96.33 |
| 4,615,299 | 10/1986 | Matsuyama et al. | 118/723 E |
| 4,633,809 | 1/1987 | Hirose | 118/719 |
| 4,958,594 | 9/1990 | Yamazaki | 118/723 E |
| 5,013,580 | 5/1991 | Meunier et al. | 427/39 |
| 5,110,437 | 5/1992 | Yamada et al. | 204/298.33 |
| 5,162,962 | 11/1992 | Yamauchi et al | 360/130.34 |
| 5,539,372 | 7/1996 | Ishiyama et al. | 338/32 R |
| 5,563,755 | 10/1996 | Kawakami et al | 360/130.21 |
| 5,611,862 | 3/1997 | Lee et al. | 118/723 E |

OTHER PUBLICATIONS

Nikkei Electronics asia, pp. 40–41, Sept. 1993, S. Miyoshi, "10 Japanese, Europena VCR Makers Move to Standardize Digital HDTV VCR for Homes ".

Thin Soliid Films, vol. 212, pp. 240–244, 1992, N. Nakaue, et al., "Applications of Diamond–Like Carbon Films to Electronic Components".

Primary Examiner—Jefferson Evans
Attorney, Agent, or Firm—Oblon, Spivak, McClelland, Maier & Neustadt, P.C.

[57] ABSTRACT

A head drum is coated with double films, each having different characteristics, by forming a first diamond-like hard carbon film of high degree of hardness and then forming a second diamond-like hard carbon film of a lower degree of hardness thereon. The degree of hardness of the second film is lower than that of the first film. The double coating is performed by means of a synthesizing apparatus which comprises a reactor consisting of a power supply electrode, a workpiece support and an annular ground electrode spaced from the stacked head drums by a predetermined distance.

1 Claim, 3 Drawing Sheets

# VCR HEAD DRUM COATED WITH DIAMOND-LIKE HARD CARBON FILMS AND THE METHOD AND APPARATUS FOR MANUFACTURING THE SAME

This is a division of application Ser. No. 08/503,208, filed on Jul. 17, 1995, now U.S. Pat. No. 5,695,565.

BACKGROUND OF THE INVENTION

1. Field of the Invention

The present invention relates generally to a head drum for a video cassette recorder (VCR) and its fabrication method and, more particularly, to a VCR head drum which has increased abrasion resistance and lubricity and also prevents video tape damage.

2. Description of the Related Art

As the mechanism of a VCR becomes more compact and complex, the thickness of the air gap which minimizes the friction between the VCR tape and the head drum tends to decrease, which in turn increases the likelihood of contact between the tape and the drum. This tendency became more distinct as home use VCR's have gradually adopted a jog shuttle function. Accordingly, the mutual abrasion between the tape and the head drum has become a critical factor to the lifetime of a VCR. To minimize the size of a VCR, it must be possible to play the tape in a stable condition with a small driving force. To this end, it is necessary to minimize the friction between the tape and each part of the VCR.

According to a recent specification on the digital VCR or HDTV VCR published in *Nikke Electronics Asia* (September, 1993)p.40, the required information storage and playback speed of the VCR will be twice that of conventional ones. Such high speed information processing necessarily requires increased revolution speed of the head drum. Therefore, the revolution speed of the next generation VCR is expected to reach up to 9000 rpm. At this speed, the friction between the head drum and the VCR tape becomes an even more serious problem.

Accordingly, there have been many attempts to overcome this problem. According to an article published in *The journal of the Korean Institute of Metal and Materials*, 6(4), 1993 by K. R. Lee and K. Y. Eun, exhibits superior mechanical characteristics, acid resistance, and lubricity. The application of the diamond-like hard carbon film is being studied extensively, which includes the protective coating of magnetic recording media (computer hard disk, etc.), the lubricative coating of micro-mechanisms, coatings for various cutting tools like razor blades, protective coating for an optical fiber, and coating for biomedical materials such as artificial joints, etc. A research for improving the performance and durability of VCR's by coating a diamond-like hard carbon film on the side surface of the head drum which makes contact with the VCR tape was reported by H. Nakaue in *Thin Solid Films*, Vol.212(1992) p.240.

An operational test was performed with a VCR having such a head drum coated with an diamond-like hard carbon film. The test result showed that the VCR tape was damaged, and the magnetic powder separated from the tape which is mixed with the binding material badly contaminated the surface of the head drum. Moreover, the separated magnetic powder in turn caused severe damage to the surface of the head because of its high degree of hardness.

This problem occurs because the tape is damaged by the defective portions on the coated drum surface or by the edges of the drum owing to the sharply increased hardness of the coated drum surface. Thus, this problem remains to be solved before the diamond-like hard carbon film can be used as a solution to the increased friction between the head drum and the tape resulting from the higher revolution rate of the head drum.

Therefore, a need exists in the art for a method for improving the durability and abrasion resistance of a head drum without causing the aforementioned problems of damage to the VCR tape and contaminating the drum surface. The present invention fulfills this need, and further provides related advantages.

SUMMARY OF THE INVENTION

The principal object of the present invention is to minimize the friction between the head drum and VCR tape, and to provide a VCR head drum which has an improved abrasion resistance and lubricity on one hand, and does not cause the problem of tape damage and drum surface contamination on the other hand. In accordance with the present invention, a head drum coated with double diamond-like hard carbon films is provided for preventing the surface contamination of the head drum by minimizing the damage to the tape caused by the defects on the coating film.

Another object of the present invention is to provide a synthesizing apparatus adapted for mass production which lends itself to uniform synthesis of coating layers on a cylindrical substrate like a head drum.

In accordance with one aspect of the present invention, the aforementioned and other objects are accomplished by providing a head drum coated with two layers of diamond-like hard carbon films, each having different characteristics from the other, and more specifically, a head drum comprising a second layer of hard carbon film having a lower degree of hardness than the first carbon film on which the second film is formed.

In accordance with another aspect of the present invention, the aforementioned objects are also accomplished by providing a synthesizing apparatus which comprises a vacuum system, a gas supply system, a power supply system, and a reactor. The reactor comprises an electrode connected to the power supply, a workpiece support that makes contact with this electrode, on which the head drums to be processed are stacked, an annular ground electrode disposed on a concentric circle spaced from the outer surface of the stacked head drums by a predetermined distance, and an insulating portion for insulating the electrode from the outer surface of the reactor. In one embodiment of the present invention, the workpiece support comprises a contact portion which is in contact with said power supply electrode, space compensation rings disposed in the empty spaces in the workpiece support for stacking the head drums substantially flat and securing them in the workpiece support, a conductive cap disposed on the top of the stacked head drums, and an insulating cap disposed on the conductive cap.

The double diamond-like hard carbon films coated on the head drum in accordance with the present invention provide a significant advancement in the art of head drums. With the use of the head drum according to the present invention, the damage to the video tape otherwise caused by the diamond-like hard carbon film may be prevented and increased abrasion resistance and lubricity of the head drum can be obtained, thus meeting the requirements of advanced VCR technology.

Other features and advantages of the present invention will be apparent from the following more detailed description of the preferred embodiment, taken in conjunction with the accompanying drawings, which illustrate, by way of example, the principles of the present invention.

BRIEF DESCRIPTION OF THE DRAWINGS

The aforementioned aspects and other features of the invention are explained in the following description, taken in connection with the accompanying drawing wherein.

DETAILED DESCRIPTION OF THE INVENTION

Figure 3:
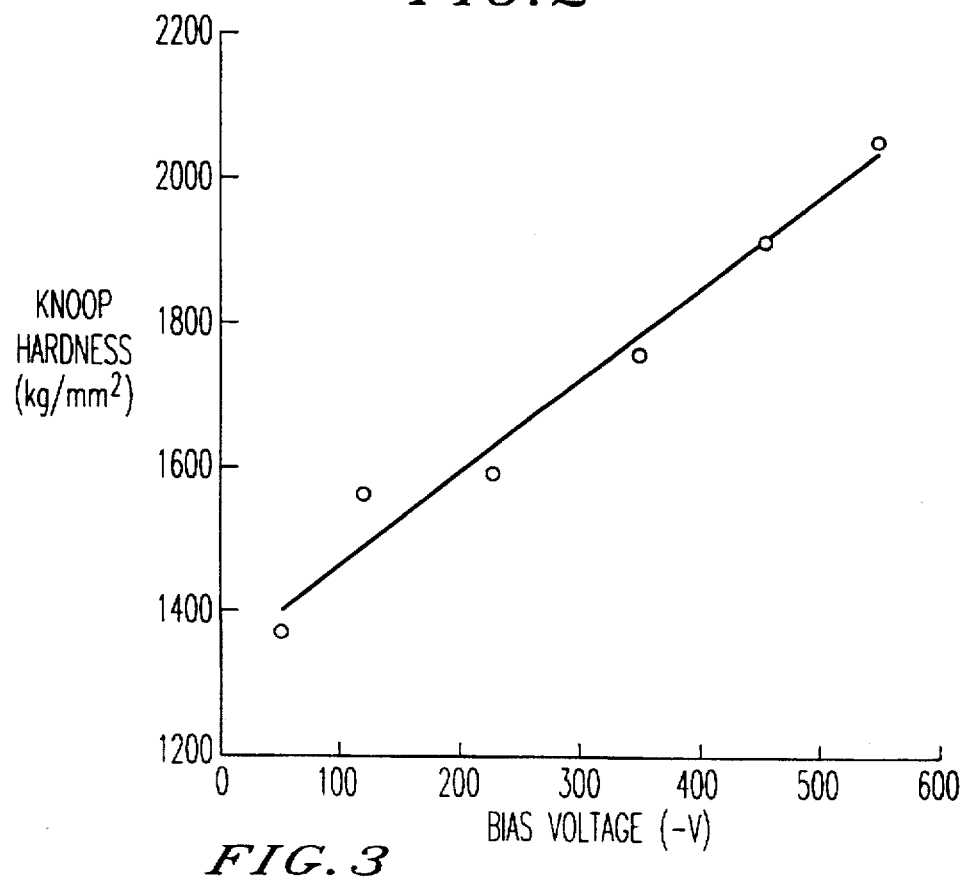
FIG. 3 is a graph showing the measured values of knoop microhardness of a diamond-like hard carbon film synthesized using high-frequency current.
Figure 4:
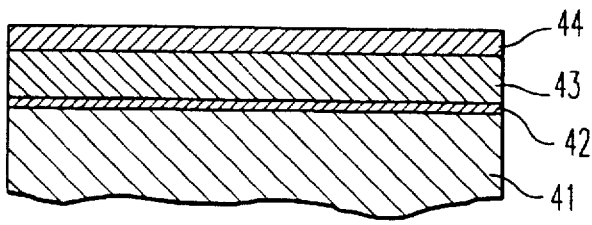
FIG. 4 is a sectional view of a drum coated with double diamond hard carbon films.

FIGS. 3 and 4 describe the principles and the technical constitution of the present invention. As mentioned previously, if the surface of a head drum is coated with a diamond-like hard carbon film for increasing its abrasion resistance, the abrasion of head drum is reduced. On the other hand, if there exist even the smallest defective portion on the coating layer, it may increase the friction coefficient of the head drum sharply and cause damage to the tape during operation owing to its increased degree of hardness. This in turn contaminates the surface of the head drum and eventually deteriorates its performance. Therefore, there exists a need to increase the hardness of the surface of the head drum to protect it, and to simultaneously lower the hardness of the surface of the head drum which makes contact with the tape to prevent the abrasion of the tape.

To investigate the hardness characteristics of a diamond-like hard carbon film, the inventors of the present application synthesized a diamond-like hard carbon film from 100% methane using a high-frequency current of 300 mA under a pressure of 1 Torr. In the synthesizing process, the bias voltage of the direct current was changed within the range from 0V to 600V, and the change in the knoop microhardness of the synthesized diamond-like hard carbon film corresponding to the change of the bias voltage applied to the drum surface was monitored. FIG. 3 illustrates the results of the monitoring. As shown in FIG. 3, the hardness of diamond-like hard carbon film has a tendency to increase monotonously from 1400 $Kg/mm^2$ to 2050 $Kg/mm^2$ as the bias voltage increases from −90V to −550V.

Therefore, the aforementioned problem can be solved by forming a second, less hard diamond-like carbon film on the first diamond-like hard carbon film coated on the head drum using the characteristics depicted in FIG. 3.

As illustrated in FIG. 4, in order to increase the adhesive force of a coating film, a transitional synthetic layer 42 is first formed on the Al alloy drum substrate 41, and the first coating layer 43 which serves as a drum surface protecting layer for increasing the head drum's durability and abrasion resistance is formed thereon. The first coating layer 43 is a diamond-like carbon film having a high degree of hardness formed by applying high bias voltage to the substrate.

A second coating layer 44 for protecting the tape is then formed on the first coating layer. This second coating layer is a diamond-like carbon film having a low degree of hardness synthesized under a low bias voltage. In order to minimize the abrasion of the tape caused by the coating layer, the hardness of the second coating layer is less than that of the first coating layer.

The process of coating double films having different mechanical properties from each other can be performed by means of the synthesizing apparatus to be described hereinafter. In order to lower the bias voltage applied to the substrate, this apparatus uses a method that cuts off the direct current source and uses a self bias voltage induced by a high-frequency current or a method that lowers the self bias voltage further by lowering the voltage of the high-frequency current itself.

Figure 1:
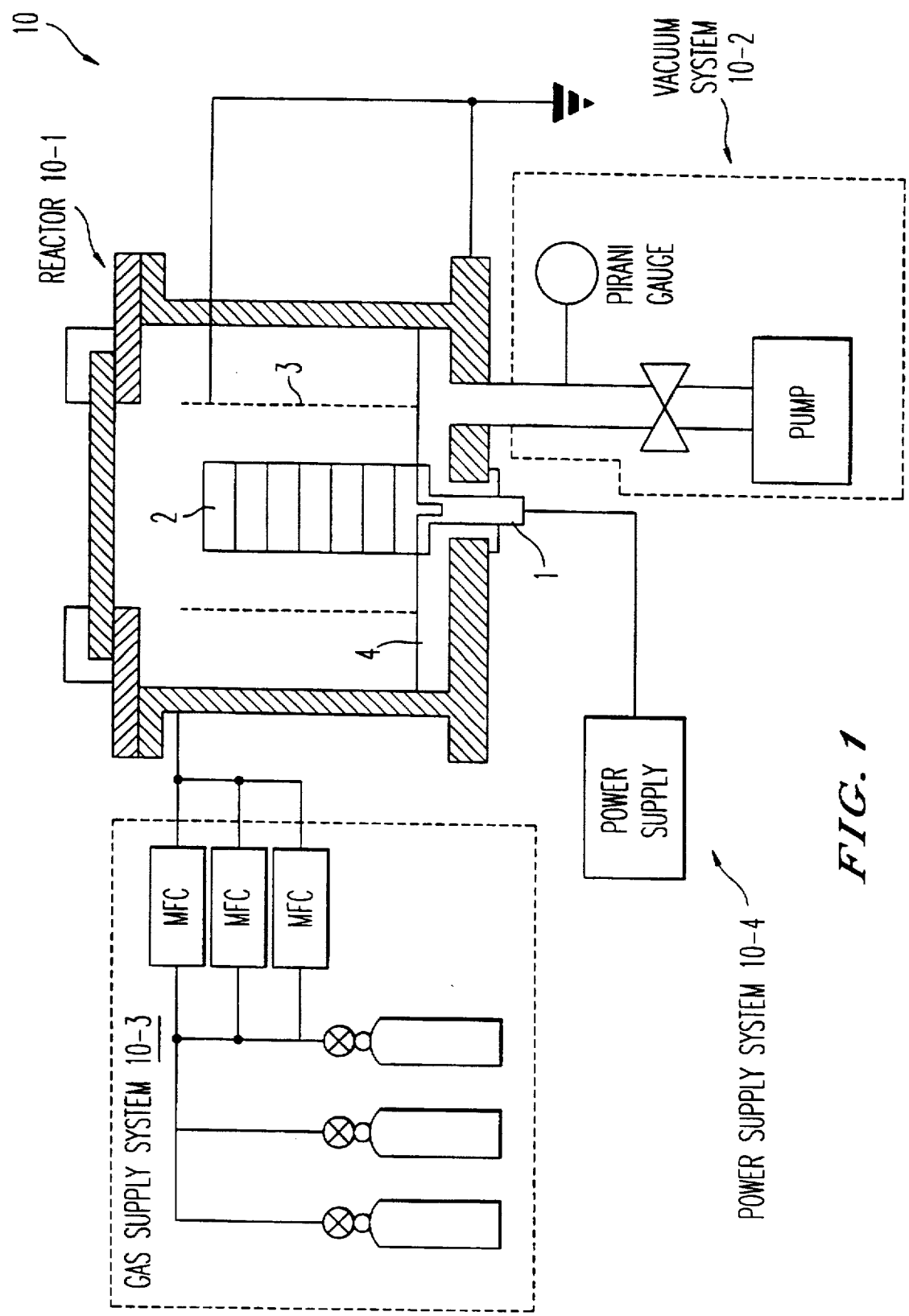
FIG. 1 is a schematic sectional view of a carbon film synthesizing apparatus according to the present invention.
Figure 2:
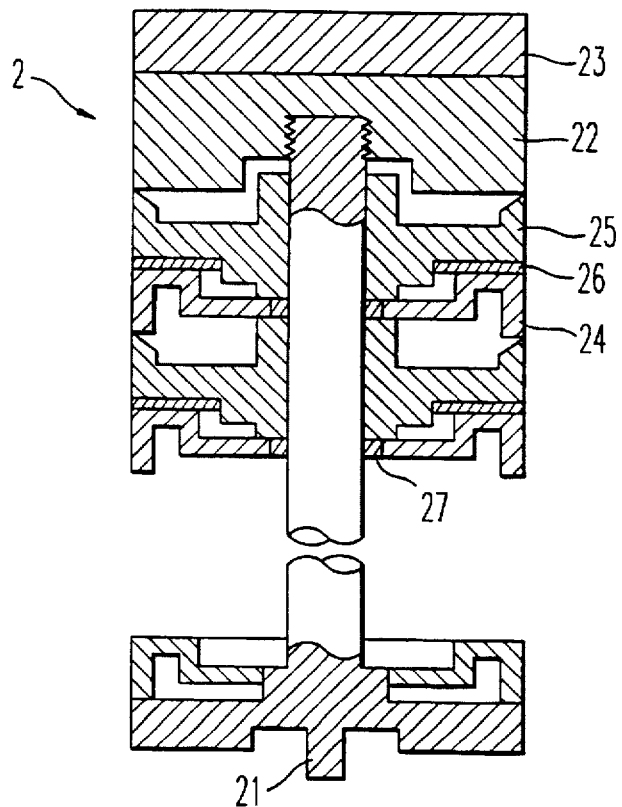
FIG. 2 is a detailed sectional view of a workpiece support according to the present invention.

The process for forming the double coating films on the surface of the head drum can be performed using the synthesizing apparatus 10 illustrated in FIG. 1 and FIG. 2. As shown in FIG. 1, the synthesizing apparatus 10 generally comprises a reactor 10-1. A vacuum system 10-2, a gas supply system 10-3, and a power supply system 10-4. The vacuum system 10-2, gas supply system 10-3, and power supply system 10-4 are similar to the plasma CVD apparatus disclosed in the Korean Patent Application No. 94-201 (the "94-201 Application") entitled "A Method for Synthesizing Diamond-like Hard Carbon Film" and filed on Jan. 7, 1994 by the applicants of the present application. In this apparatus, as described in the No. 94-201 Application, it is possible to independently control the bias voltage applied to the substrate and the plasma current. The detailed explanation on the parts similar to those disclosed in the No. 94-201 Application is omitted.

In a preferred embodiment of the diamond-like hard carbon film synthesizing apparatus, an electrode is disposed in the apparatus to allow an uniform synthesis on a circular substrate by the plasma CVD method. The plasma CVD method uses a high-frequency current in a range of 100 kHz to 15 MHz, which generates plasma with a reasonably high density and ion energy, as the main power and superposes a direct current in order to control the ion energy.

To describe the reactor 10-1 in detail, an electrode 1 is disposed in the center of the bottom of the reactor, and a workpiece support 2 on which VTR head drums are stacked is attached to the electrode 1. An annular shield type ground electrode 3 is disposed on the concentric circle spaced by 1–10 cm from the surfaces of the stacked head drums. When the distance between the drum surface and the ground electrode is less than 1 cm, plasma is generated locally and, therefore, the coating rate along the circumference of the head drum becomes irregular. As the distance increases the uniformity increases as well, but the uniformity ceases to increase in the distance beyond 10 cm. Therefore, it would not be economical to space the ground electrode more than 10 cm from the drum surface.

To determine the optimal current frequency and the distance between the drum surface and the ground electrode for synthesizing diamond-like hard carbon film on the VCR head drum 24,25, the frequency was switched to 100 kHz, 250 kHz, 500 kHz and 13.56 MHz, and the distance was changed in the range of 1 cm to 10 cm. The synthesizing pressure was also changed in the range of 0.1 Torr to 1 Torr.

After synthesizing the carbon film from methane gas for 10 minutes using a high frequency voltage of 700 V, the change in the temperature of the drum surface was measured. The surface temperature showed a tendency to increase as the pressure increased and the frequency decreased. Because the plasma density and the ion energy increase under these conditions. Therefore, it is evident from the fact that the film formation is promoted under the conditions of low frequency and high pressure because the high ion energy and the high temperature of the drum surface is advantageous for the formation of Al—C composite layer at the interface of the head drum and the diamond-like carbon film. But, because the head drum cannot be cooled by coolants during the coating process, the temperature should be controlled so that it does not rise too high. In this embodiment, we adopted the condition of 250 kHz and 1 Torr, under which the drum surface temperature does not exceed 150° C. after 10 minutes of operation.

The distance between the ground electrode and the drum surface affects the plasma uniformity along the circumference of the head drum significantly. Under a set pressure, plasma tended to be generated locally as the distance shortened, and this tendency becomes stronger as the pressure is lowered. The local generation of plasma caused the thickness of the coated film to be nonuniform. The uniformity of plasma increased with the increase in distance, and the minimum distance which allows the acceptable uniformity of plasma shortened with the increase in pressure. Therefore, it is necessary to optimize this distance because an increase in the distance necessarily results in a bigger size of the synthesizing apparatus. In this embodiment, with the pressure of 1 Torr, the optimum distance was found to be 4 cm.

This type of electrode arrangement generates very uniform plasma on the surface of the cylindrical workpiece. Therefore, this arrangement has an advantage in that it does not require additional manipulation, such as the rotation of the workpiece, in order to form uniform coating on the surface of the workpiece. In addition, it can be easily adapted to a manufacturing apparatus by connecting a number of plasma generators consisting of a power electrode and a ground electrode forming a pair in a parallel arrangement.

Referring to FIG. 2, the sectional view of the workpiece support 2 according to the present invention is shown in detail. The workpiece support 2 is made of conductive materials such as Al or stainless steel, and is connected to the power source via power supply electrode 1 through the electrode contact portion 21. Using the center holes of upper part 24 and lower part 25 of the head drum, the drums are stacked on the workpiece support in sequence and the gap between the top surface of the upper part and the bottom surface of the lower part stacked on the upper part is filled with a compensation ring 26 in order to make the surface of the stacked drums smooth. The gap between the workpiece support and the center hole of the upper part of the drum, which exists because of the center hole's diametrical difference between the upper part and the lower part, is filled with a compensating ring 27 in order to secure the position of the upper part 24. At the top of the stacked drums, a conductive cap 23 for fixing the stacked drums is placed and an insulating cap 22 made of insulating materials such as teflon is placed thereon to insulate the stacked drums. The insulating cap can be made of any kind of insulating material.

In the foregoing, the present invention has been described exemplifying an embodiment for forming multiple coating layers using the CVD technique. However, the multiple layer forming method according to the present invention is not limited to the described embodiment. Methods for forming diamond-like hard carbon film, various methods including ion depositing, ion plating, ECR, sputtering and laser ablation techniques are widely known. Notwithstanding method used for forming the film, the hardness of the diamond-like carbon film can be easily controlled by changing a synthesizing condition; in particular, the ion energy.

The advantageous effects and superior quality of the head drum coated with double diamond-like carbon films according to the present invention compared to a single film coated head drum, TiN coated head drum and non-coated head drum will be discussed in detail below.

Test 1: Comparison of the Characteristics of a Head Drum Coated with Single Diamond-like Hard Carbon Film with an Uncoated Head Drum and a TiN Coated Head Drum In this test, the friction coefficient of a head drum coated with a single diamond-like hard carbon film was compared with a TiN coated head drum and an uncoated head drum.

Four sets of VTR head drums having a diameter of 62 mm were stacked on the workpiece support as shown in FIG. 2, which was placed in a diamond-like hard carbon film synthesizing apparatus as shown in FIG. 1. These head drums had been subjected to preliminary treatments such as plasma cleaning and transitional synthesis using the method disclosed in Korean Patent Application No. 94-202 titled "A Method for Increasing the Adhesive Force of a Diamond-like Hard Carbon Film" filed on Jan. 1, 1994 by the applicants of the present application. A diamond-like hard carbon film was synthesized from methane for 40 minutes under the reaction pressure of 1 Torr using high-frequency current of 300 mA, direct current of 119 mA and a substrate bias voltage of −550V. The thickness of the synthesized diamond-like hard carbon film was 1.0 micrometer and the thickness was uniform throughout the circumference of the head drum.

Before and after the abrasion resistance test, the friction coefficient between the head drum and the tape was measured for a head drum coated with a single diamond-like hard carbon film, a head drum coated with TiN and an uncoated head drum. The abrasion tester used to measure the friction coefficient is disclosed in Korean Patent application No. 94-9687 titled "An Apparatus for Measuring the Abrasion Characteristic and Friction Coefficient of the Sidewall of a Cylindrical Object" filed by the present applicants.

Figure 5:
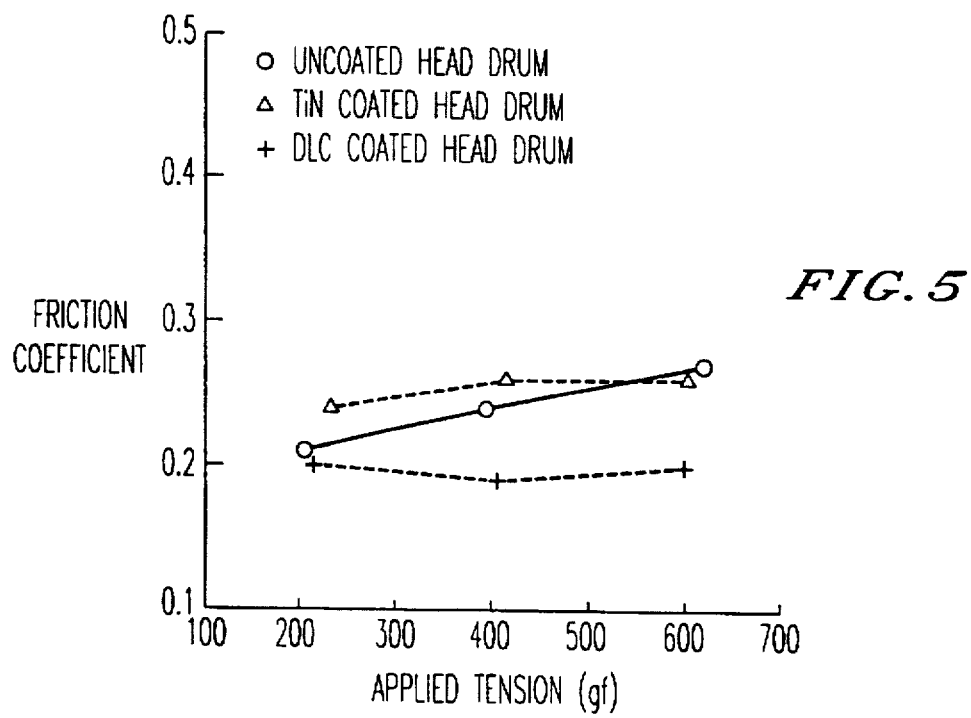
FIG. 5 is a graph showing the contact friction coefficients measured before the abrasion resistance test for a non-coated drum and drums each coated with TiN or a diamond-like hard carbon film.

The graph in FIG. 5 shows the changes of the friction coefficient between the VTR tape and head drum before performing the abrasion resistance test as a function of the tensile force applied to the tape. Referring to the graph, at the revolution rate of 50 rpm, under which the contact friction is tested, the friction coefficient of the head drum coated with a single film shows the value of the 0.2, which is lower than those of uncoated drum and TiN coated drum. Moreover, as shown in FIG. 5, the friction coefficient of the head drum coated with a diamond hard carbon film is remarkably less dependent on the tensile force applied to the tape than the other head drums.

Figure 6:
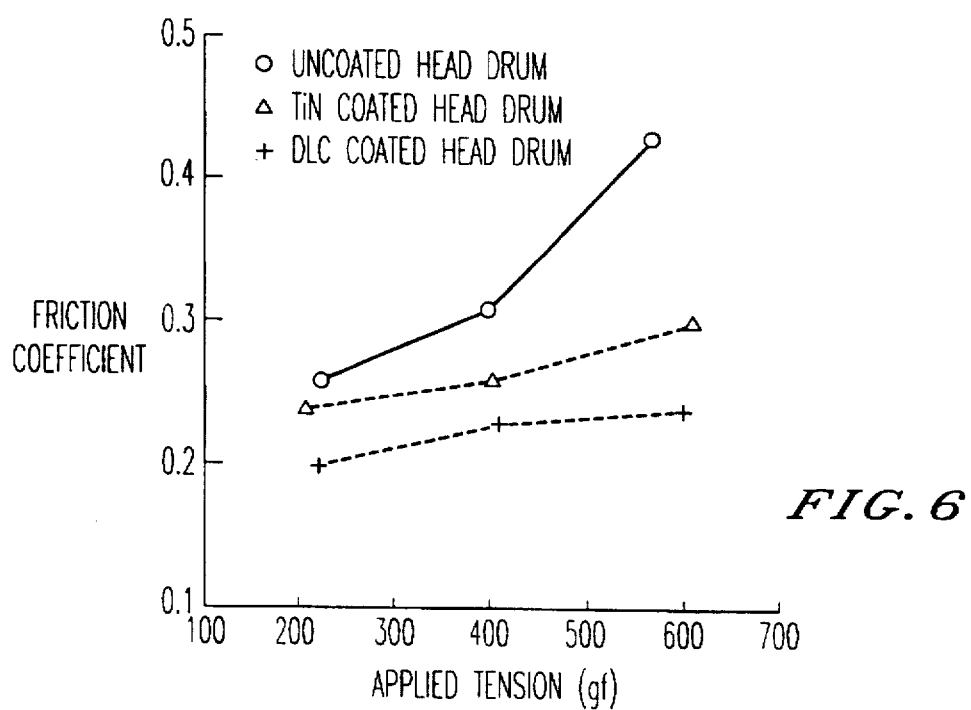
FIG. 6 is a graph showing the contact friction coefficients measured after the abrasion resistance test for a non-coated drum and the drums each coated with TiN or a diamond-like hard carbon film.

FIG. 6 shows the contact friction coefficient measured after these head drums were subject to the abrasion resistance test for 4 hours in a manner that the drums are subject to abrasion at the angular rates of 0 rpm and 3000 rpm, alternating every 10 seconds under the tensile force of 400 gf. In the case of the uncoated head drum or the TiN coated head drum, the friction coefficients increased notably as compared with the values measured before the test, and the values changed within the range of 0.27 to 0.43 or 0.24 to 0.3 respectively, depending on the change in the tensile force. However, the friction coefficient of the head drum coated with the diamond-like hard carbon film changed within the range of 0.2 to 0.25, depending on the applied tensile force.

On the other hand, before the abrasion resistance test, all of the head drums had a very low friction coefficient of about 0.05 at a revolution rate of 1500 rpm because of the air gap formed between the drum surface and the tape. But, after the test, the uncoated drum showed a friction coefficient within the range of 0.16 to 0.42 as the tensile force increases from 200 fg to 600 fg, and the TiN coated drum showed the value within the range of 0.1 to 0.22. On the contrary, the head drum coated with the diamond-like hard carbon film showed almost the same value as before the abrasion test.

This means that the surface of the head drum coated with diamond-like hard carbon film suffered little damage in the course of the abrasion resistance test. In the case of the uncoated head drum, the microstructure of the drum surface was severely damaged during the abrasion test, but no damage was observed on the surface of the head drum coated with diamond-like hard carbon film.

Test 2: Field Test for a Head Drum Coated with a Single Diamond-like Hard Carbon Film The head drum used in Test 1 was mounted on a VTR and a field operation test was performed under the temperature of 40° C., and the relative humidity of 70%. The test was performed for 1000 hours with the alternating operation modes, in which FF mode(11 seconds), REW mode(9 seconds), CUE mode(11 seconds) and REV mode(8 seconds) were used in succession.

After the completion of this field test, a large quantity of foreign substance was attached to the surface of the head drum coated with single diamond-like hard carbon film. An EDS analysis revealed that this foreign substance consisted of the magnetic powder and bonding material separated from the tape. This means that the drum was protected effectively by a the hard film coating, but the coating caused damage to the tape instead. Therefore, a hard carbon film coating of the drum has a problem of damaging the tape.

Test 3: Comparison of the Characteristics of a Head Drum Coated with Double Diamond-like Hard Carbon Films with an Uncoated Head Drum and TIN Coated Head Drum In this test, the first diamond-like hard carbon film was synthesized for 10 minutes under the same conditions as Test 1 using the synthesizing apparatus 10 in FIG. 1. The second coating film was synthesized on the first film for 10 minutes under the conditions of 1 Torr pressure, 250 mA high-frequency current and 250V substrate bias voltage to form the double layer of coating films. The second coating film was synthesized to have a hardness of 1600 Kg/mm$^2$, which is lower than the hardness of 2050 Kg/mm$^2$ of the first coating film.

The changes in the friction coefficients and in the abrasion rates measured before and after the abrasion resistance test was similar to those of the single carbon film measured in Test 1, and no particular difference was observed. The surface contamination of the head drum, which resulted in Test 2, was not observed. This means that the combination of the first coating film and the second coating film, which was formed on the first coating layer and having a lower degree hardness than the first coating layer, minimized the damage of the tape while maintaining the abrasion resistance of the head drum.

Therefore, during the operation of a VTR, the double diamond-like hard carbon films coated on the head drum-effectively lowered the friction coefficients and raised the durability of the head drum without causing deterioration of the performance of the head drum from tape damage.

It will, of course, be understood that modifications of the present invention and its various aspects will be apparent to those skilled in the art. As such, the scope of the invention should not be limited by the particular embodiment herein described, but should be defined only by the appended claims and equivalents thereof.

What is claimed is:

1. A VCR head drum coated with double diamond-like hard carbon films having different characteristics from each other comprising:

a head drum;

an intermediate layer provided on the head surface of said head drum to promote the adhesion between said head drum and the films formed thereon;

a first diamond-like hard carbon film formed on said intermediate layer; and a second diamond-like hard carbon film formed on the first diamond-like hard carbon film and having a lower degree of hardness than that of the first diamond-like hard carbon film.

\* \* \* \* \*